United States Patent [19]

Arzubi

[11] Patent Number: 4,570,241
[45] Date of Patent: Feb. 11, 1986

[54] FET STORAGE WITH PARTITIONED BIT LINES

[75] Inventor: Luis M. Arzubi, Colchester, Vt.

[73] Assignee: International Business Machines Corporation, Armonk, N.Y.

[21] Appl. No.: 423,983

[22] Filed: Sep. 27, 1982

[30] Foreign Application Priority Data

Oct. 30, 1981 [EP] European Pat. Off. ........ 81109372.3

[51] Int. Cl.$^4$ .................. G11C 11/40; G11C 11/24
[52] U.S. Cl. ..................................... 365/205; 365/149
[58] Field of Search ............... 365/205, 149, 207, 208; 357/71; 307/530

[56] References Cited

U.S. PATENT DOCUMENTS

| | | | |
|---|---|---|---|
| 3,387,286 | 6/1968 | Dennard | 365/222 |
| 4,112,512 | 9/1978 | Arzubi et al. | 365/203 |
| 4,206,370 | 6/1980 | Leach, Jr. | 365/183 |
| 4,233,675 | 11/1980 | Karp et al. | 365/205 |
| 4,290,120 | 9/1981 | Stein | 365/205 |
| 4,366,559 | 12/1982 | Misaizu | 365/205 |
| 4,402,063 | 8/1983 | Wittwer | 365/205 |
| 4,413,330 | 11/1983 | Chao et al. | 365/205 |

FOREIGN PATENT DOCUMENTS

| | | |
|---|---|---|
| 1774482 | 2/1972 | Fed. Rep. of Germany . |
| 2431079 | 12/1976 | Fed. Rep. of Germany . |
| 2712735 | 3/1977 | Fed. Rep. of Germany . |
| 1502334 | 3/1978 | United Kingdom . |

OTHER PUBLICATIONS

Heller et al., "High Sensitivity Charge Transfer Sense Amplifier", IEEE Journal of Solid State Circuits, vol. SC-11, No. 5, Oct. 1976, pp. 596-601.
Arzubi et al., "One Device Memory Cell Arrangement with Improved Sense Signals", IBM Technical Disclosure Bulletin, vol. 23, No. 6, Nov. 1980, pp. 2331-2332.
IEEE Journal of Solid-State Circuits, vol. SC-15, #2, Apr. 1980, pp. 184-189, F. J. Smith et al., "A 64 KBit MOS Dynamic RAM with Novel Memory Capacitor".
IEEE Journal of Solid-State Circuits, vol. SC-15, #15, Oct. 1980, pp. 831-839, J. J. Barnes et al., "A High Performance Sense Amplifier for a 5 V Dynamic RAM".
IEEE Journal of Solid-State Circuits, vol. SC-15, #5, Oct. 1980, pp. 839-846, J. Y. Chan et al., "A 100 ns 5 V Only 64K×1 MOS Dynamic RAM".
IBM Technical Disclosure Bulletin, vol. 18, #3, Aug. 1975, pp. 786-787, "Semiconductor Storage Circuit Utilizing Two Device Memory Cells", H. Barsuhn et al.

*Primary Examiner*—John H. Wolff
*Assistant Examiner*—Glenn A. Gossage
*Attorney, Agent, or Firm*—Francis J. Thornton

[57] ABSTRACT

A circuit arrangement is described with a sense latch for increasing the number of dynamic FET storage cells on bit lines (BL) connected to this sense latch (SL). The storage cells proper are arranged in a semiconductor structure having a diffusion layer acting as a conductor and a multiple metal layer. The outputs of the sense latch (SL) are connected to two pairs of cross-coupled charge storge elements (BB) acting as bit line coupling transistors which are connected to extended partitioned bit line pairs (BL1, BL1', and BL2, BL2'). Each section has its own reference cells and is coupled to the sense latch (SL), the sections furthest from the sense latch are coupled through low-capacity metal lines, and charge coupling elements (BB). These metal sections of the bit lines meander over the surface of the semiconductor structure.

6 Claims, 3 Drawing Figures

FET STORAGE WITH PARTITIONED BIT LINES

BACKGROUND OF THE INVENTION

The invention relates to a FET storage and more particularly to FET storage with sense latch for increasing the number of dynamic FET storage cells on the bit lines (BL) connected to this sense latch (SL), wherein the storage cells are arranged at the crossing of word lines (WL) and bit line pairs (BL1, BL2) in a multilayer metal semiconductor structure and are connected by addressable bit switches (B/S) to read/write drivers, and wherein one sense latch (SL) is associated with each bit line pair.

Highly integrated capacitive storages and field-effect transistors are known in principle. Thus, for example, German Offenlegungsschrift No. 1,774,482 describes a capacitive word-oriented storage, each of whose cells consists of one field-effect transistor and one capacitor. One node of the transistor is connected to the capacitor, the other to the bit line, the gate electrode to the word line and the substrate node to an operating voltage source. Such a single transistor storage cell consisting of field-effect transistors has the advantage that its integration density is high and its manufacturing process relatively simple.

However, the main disadvantage of such a single FET storage cell is that information is read or written relatively slowly. Apart from this, the read signal is relatively small and the capacitive load of the bit and word lines relatively high. As the packing density of such storages increases, serious problems are encountered in so far as during reading or sensing the contents of a storage cell the signal is no longer discernibly small. This necessitates extremely complicated sense circuits on the one hand and very strict observance of the times and levels of a number of successive control signals on the other. The signal sequence for a read operation differs from that for a write operation, so that such a storage requires many peripheral circuits for its operation. At the same time, the operating speed declines as the magnitude of the sensed signal decreases.

To achieve faster read/write cycles, integrated dynamic semiconductor storages with cells of two field-effect transistors have been developed. Such a storage with two storage capacitors, each accessible by one field-effect transistor, is known from IBM Technical Disclosure Bulletin, Vol. 18, No. 3, August 1975, pp. 786 and 787, and German Pat. No. 2,431,079. According to this material, each storage cell consists of two series circuits with one storage capacitor and one read/write field-effect transistor each. These series circuits are arranged between the bit lines of a bit line pair and a common AC grounded node. A common word line links the control electrodes of the two transistors. When the information of an addressed storage cell is read, the difference signal on both bit lines is fed to a latch for amplification. This circuit arrangement ensures a high read/write speed with a relatively simple control signal sequence. However, an essential disadvantage is that the number of storage cells for each bit line is limited, as otherwise the capacitive load would become too great, so that the storage cell size, the line width or the peripheral circuits would be increased considerably or the read signal would become so small that it could no longer be reliably sensed without excessive means.

To further improve the speed and to simplify the time control, German Pat. No. 2,712,735 provides for the early selection of the bit line switches, necessary for linking the storage cell area and the data input/output lines, to be effected by a low control pulse, so that as a function of the difference signal occurring, which is preferably preamplified and applied to the appertaining bit line pair by a storage cell, the switching threshold of only one of the two bit line switches is exceeded, while the bit line switch in the other bit line remains latched, preventing the potential of that bit line, and thus the potential of the cell node connected thereto, from dropping. A further reduction in the access time by reducing the time for sensing the stored values is not attainable without difficulties, as in such a case the information could no longer be reliably sensed and a signal that has been too strongly reduced would necessitate a low speed anyhow. Apart from this, the number of cells for each bit line is limited by the capacitive loads.

A 64K-bit MOS dynamic RAM is described in IEEE, Journal of SCC, pp. 184 to 189, of April 1980 under the title "A 64 Kilobit Dynamic RAM" by F. Smith et al. This storage, too, has the disadvantage that the number of cells for each bit line is limited by the capacitive load. If the number of storage cells for each bit line were to be increased considerably, the higher detrimental capacities of such a storage would have to be compensated for by higher currents, wider lines and more complicated peripheral circuits.

Therefore, it is the object of the invention to provide a storage with cells of field-effect transistors, wherein one latch is common to the bit lines and the number of storage cells persense latch can be doubled, without increasing the storage cell size or line width and without the peripheral circuits being subjected to critical technical requirements.

SUMMARY OF THE INVENTION

The solution in accordance with the invention is characterized in that the outputs of the sense latch (SL) are connected to two pairs of cross-coupled charge storage elements (BB) acting as bit line coupling transistors and that double the number of bit line pairs (BL1, BL1' and BL2, BL2') are connected to the charge coupling elements (BB).

By partitioning the bit lines, using a second metal layer for wiring and the self-isolating characteristics of the latch serving as a read amplifier, the number of bits per sense latch is doubled, without increasing the cell size and without reducing the read signal to such an extent that more complicated peripheral circuits become necessary. These measures save up to 20 percent of chip semiconductor surface, without complicated manufacturing processes being required.

DESCRIPTION OF THE DRAWINGS

The invention is described in detail below with reference to drawings, in which.

DESCRIPTION OF THE EMBODIMENT

Figure 1:
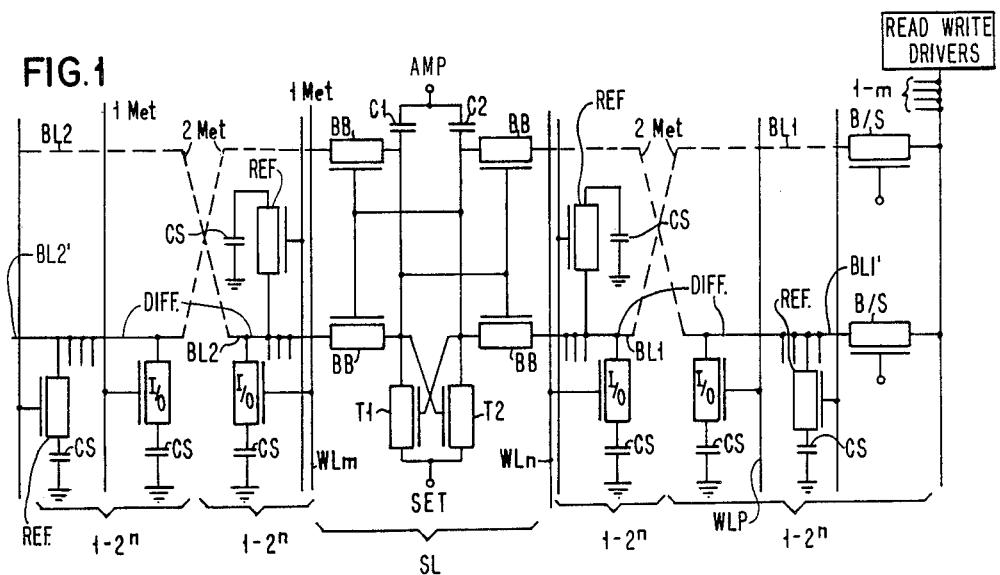
FIG. 1 is a basic circuit diagram.

The basic circuit diagram of FIG. 1 shows in the center the sense latch SL consisting of the cross-coupled transistors T1 and T2 as well as four bit line coupling transistors BB, and the two capacitors C1 and C2.

Figure 1A:
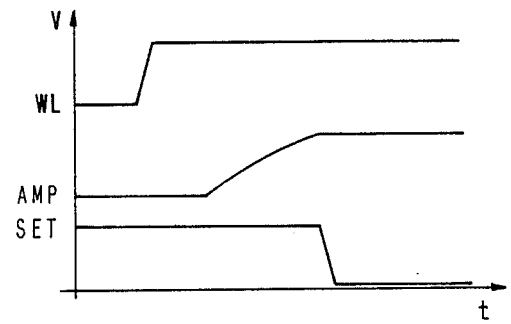
FIG. 1A is a pulse diagram.

The voltage curves for nodes AMP and SET are shown in relation to the potential at the word line WL in FIG. 1A. It is pointed out that such sense latches are known from the above-cited prior art.

A line serving as a second conductive metal layer and connected to the diffusion layer serving as bit lines BL1' and BL2', respectively, is linked with bit line coupling transistor BB on the upper left and the upper right. The lower two bit line coupling transistors BB are respectively connected to bit line BL1 and BL2 which are diffusions. First groups of storage cells, taking the form of single FET storage cells in this case, have one input transistor I/O and one storage capacitor CS, whose other electrode is connected to ground, linked with these bit lines BL1 and BL2. Selection can be effected by word lines WLn or WLm crossing the bit lines. The second group of storage cells belonging to bit lines BL1' and BL2' are selected by word lines WLp or WLb and are connected to the diffusion layer which through the second metal layer 2Met is connected to the respective upper bit line coupling transistors BB of sense latch SL. As shown, bit lines BL1 and BL1' have their switches B/S connected to a common bus, to which further bit lines 1 to m are connected. In this example, the word lines are arranged in the first metal layer 1Met.

As the second metal layer, through which the second group of storage cells are connected on the left and the right to sense latch SL, have a very low capacity and as, in addition, there are the bit line coupling transistors BB, the output signal during cell reading is not negatively influenced, so that, compared with previously known solutions, only one sense latch is needed for double the number of cells, without reducing the speed in any way. The arrangement in accordance with the invention also permits one decoder to serve double the number of storage cells. In addition, the four bit line coupling transistors BB in sense latch SL permit independently controlling of each bit line section, so that the storage cells of one section can be set independently of the cells in another. For independent setting, each section is provided with its own reference cells REF.

Figure 2:
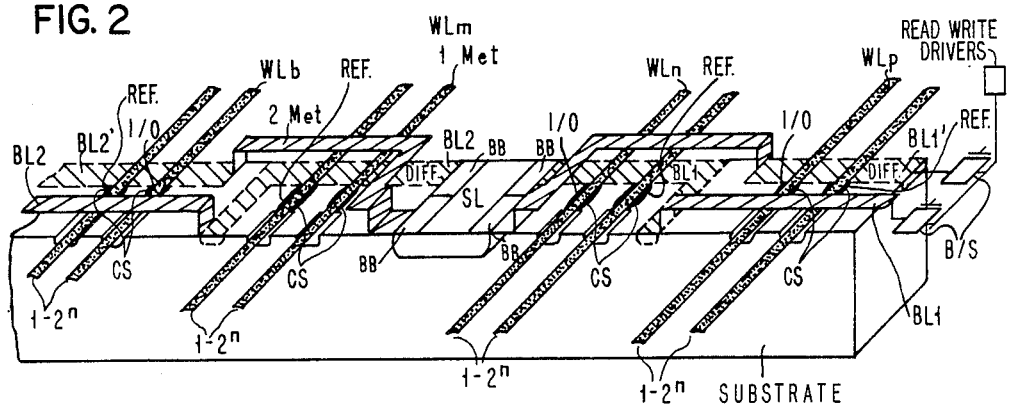
FIG. 2 is a schematic perspective representation of the layout principle of the circuit according to FIG. 1 in multilayer technology.

By means of FIG. 2 it is shown how the circuit arrangement according to FIG. 1 can be readily produced in a multilayer metal process. For this purpose, a perspective view of a semiconductor substrate provided with two metal layers 1Met and 2Met has been chosen. The sense latch SL with the bit line coupling transistors BB, designed as charge coupling elements, is shown in the center of the substrate block. This representation shows quite clearly the bit lines BL1 and BL2 acting as diffusion and connected to the two upper (in FIG. 1 the lower) cross-coupled charge elements BB. These two diffusion lines BL1 and BL2 are crossed by metal lines of the first layer, which act as word lines WL. The two groups of word lines WLm and WLn are crossed by a metal line in the second metal layer 2Met. These two metal lines are connected to the two bit line coupling transistors BB designed as charge coupling elements. On the other side, these two metal lines are connected to the extended bit lines BL1' and BL2', respectively, in the diffusion. As can be seen from FIG. 2, the actual storage capacitor CS and the input/output transistor I/O of the cells are arranged below the word lines WL. It is pointed out that the designations of the individual lines and components in FIG. 2 concur with those in the circuit diagram of FIG. 1.

In this case, the second metal layer 2Met, which perpendicularly crosses the word lines WLp, also serves to connect the diffusion bit line BL1 to the appropriate bit switch B/S. This applies in analogy to the diffusion bit line BL2 in the left part. This representation shows quite clearly that by connecting the cross-coupled bit line coupling transistors BB, designed as charge coupling elements, to the sense latch SL and by using the diffusion layer and the second metal layer as a bit line, as well as by employing the first metal layer as a word line, the number of storage cells connected to a sense latch and a decoder is doubled, without the read signal being detrimentally capacitively affected and the storage cell having to be increased as a result of undesired capacities. Therefore, the space savings on a semiconductor chip are substantially increased by the arrangement in accordance with the invention.

What is claimed is:

1. In a semiconductor body an FET storage for increasing the number of bit lines connected to a sense latch, comprising a plurality of word lines and a plurality of bit lines, wherein the storage cells are arranged at the crossing of the word lines and the bit lines in a multilayer metal semiconductor structure, each of said bit lines connected by a respective addressable bit switch to a respective read/write driver and connected to a respective output of a single sense latch, characterized in that each respective output of the sense latch is connected through respective cross-coupled charge storage elements acting as bit line coupling transistors to each of said bit lines.

2. The FET storage of claim 1 wherein said bit lines are arranged in a plurality of pairs, the bit lines of each pair being positioned on opposite sides of the sense latch, a first one of said pairs of bit lines being positioned immediately adjacent the sense latch and laterally extending therefrom, and each of the additional pairs of bit lines being positioned in line with said first one of said pairs of bit lines and laterally extending away from the sense amplifier and said first one of said pairs of bit lines.

3. The FET storage of claim 1 wherein each bit line has its own reference cell, and the first of said plurality of bit lines on each side of the sense latch is formed immediately adjacent the sense latch, and each additional bit line on each side of the sense latch is formed substantially in line with but spaced from said sense latch by said first bit line and laterally extending away from said first bit line and the sense latch, each of the additional bit lines on each side of said latch being connected to respective charge storage elements coupling said lines to said sense latch, by a metal line having a low capacitance.

4. The FET storage of claim 3 wherein each of said bit lines comprises a diffused line formed in said body.

5. The FET storage of claim 3 wherein the word lines are formed from a first metal layer disposed on the body and substantially perpendicular to the respective bit lines.

6. The FET storage of claim 5 wherein the low capacity metal lines connecting the additional bit lines to their respective charge storage elements are formed of a second metal layer insulated from said first metal layer and lying substantially parallel to the bit lines.

* * * * *